United States Patent [19]

Parker et al.

[11] Patent Number: 4,651,064
[45] Date of Patent: Mar. 17, 1987

[54] VIDEO AMPLIFIER WITH FOREGROUND AND BACKGROUND CONTROLS

[75] Inventors: Stephen J. Parker, Bountiful; Clayton C. Wahlquist, West Valley City, both of Utah

[73] Assignee: Sperry Corporation, New York, N.Y.

[21] Appl. No.: 650,149

[22] Filed: Sep. 13, 1984

[51] Int. Cl.[4] .............................................. H01J 29/52
[52] U.S. Cl. .................................... 315/383; 358/168; 358/169
[58] Field of Search ................. 315/383; 358/168, 169

[56] References Cited

U.S. PATENT DOCUMENTS 3,946,275  3/1976  Marino .................................. 315/383
4,086,579  4/1978  Easter .................................. 315/383

Primary Examiner—Theodore M. Blum
Attorney, Agent, or Firm—John B. Sowell; Thomas J. Scott; Laurence J. Marhoefer

[57] ABSTRACT

A video display terminal is provided with controls which permit independent adjustment of the background information and the foreground information. Each control comprises an adjustable constant current source connected to one of two branches of a differential amplifier. One branch of the differential amplifier is employed to control the background intensity and the other branch of the differential amplifier is employed to control the foreground intensity.

15 Claims, 7 Drawing Figures

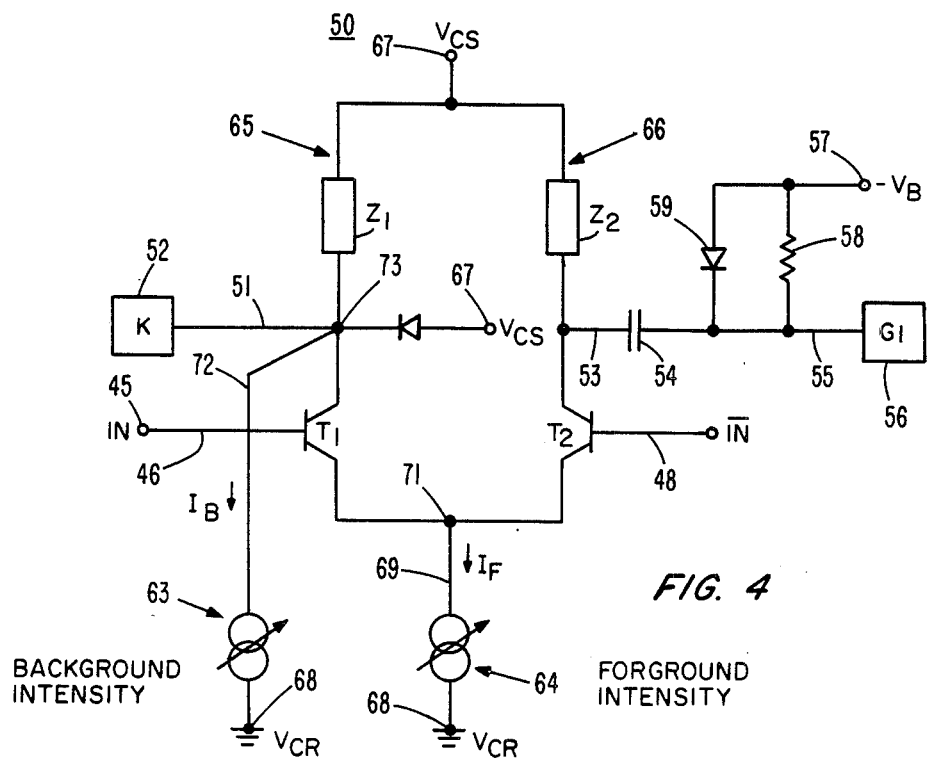
FIG. 4
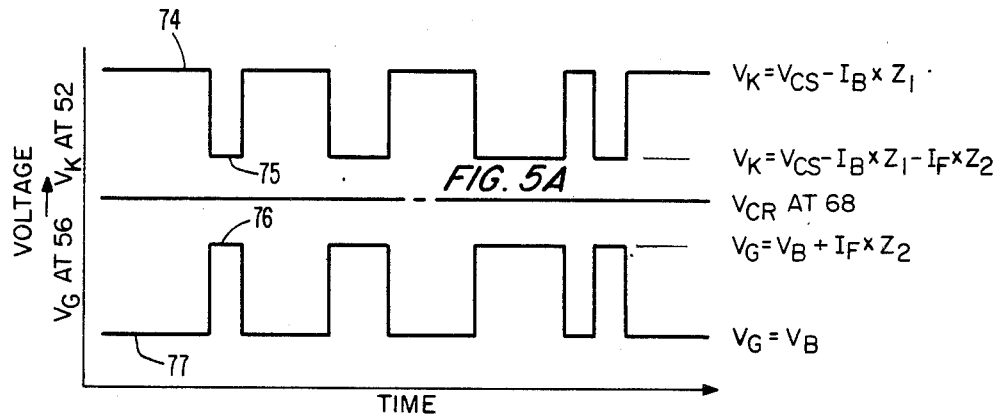
FIG. 5A
FIG. 5B
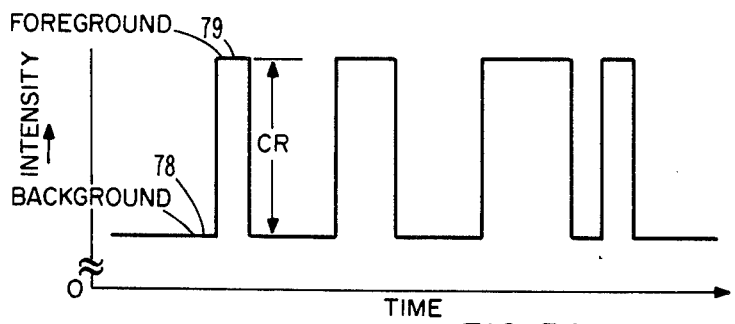
FIG. 5C ial amplifier employed in the present invention video
VIDEO AMPLIFIER WITH FOREGROUND AND BACKGROUND CONTROLS

BACKGROUND OF THE INVENTION

1. Field of the Invention

This invention relates to video amplifiers of the type employed to control the characters and background information on a cathode ray tube (CRT). More particularly, the present invention video amplifier relates to the independent control of the background intensity and the foreground intensity of the information on a cathode ray tube.

2. Description of the Prior Art

Heretofore, video display terminals and television sets were provided with contrast and brightness controls which are interactive. The contrast control adjusts the amplitude of the input signal to affect the intensity of the information being displayed. The brightness control adjusts the voltage level on the first control grid of the CRT to affect the luminous level of all information on the tube of the CRT. These prior art contrast and brightness controls are acceptable when embodied into standard television sets. Similarly, most prior art video display terminals (VDT's) do not illuminate the background. However, VDT's with ergonomic enhancements preferable have background illumination that is adjustable.

Heretofore, such illuminescent adjustment has been accomplished by the aforementioned brightness and contrast controls which by definition are interactive. It would be desirable to provide a video display terminal with ergonomic enhancements which permit independent adjustment of the intensity of the background information and the foreground information.

SUMMARY OF THE INVENTION

It is a principal object of the present invention to provide a novel video amplifier with independent non interactive background and foreground controls.

It is another principal object of the present invention to provide a simple and inexpensive video amplifier for independently controlling the intensity of the background and foreground information on a cathode ray tube.

It is another object of the present invention to provide a simple and inexpensive video amplifier circuit which may be embodied in all types of video display terminals.

It is yet another general object of the present invention to provide a novel video amplifier which may be retrofitted into existing video display terminals to provide ergonomic enhanced video display terminals.

According to these and other objects of the present invention, there is provided a novel differential amplifier of the type having a pair of differential input terminals and a pair of differential output terminals. A foreground control is connected to the differential amplifier for controlling voltage of the cathode and the first grid and a background control is connected to the differential amplifier for controlling the voltage of the cathode alone so that the intensity of the background and the foreground are independently controlled.

BRIEF DESCRIPTION OF THE DRAWINGS

FIG. 4 is a schematic diagram of the novel differential amplifier employed in the present invention video amplifier shown in FIG. 3; and FIGS. 5A, 5B and 5C are output waveforms employed to explain the video amplifier shown in FIG. 4.

DESCRIPTION OF THE PREFERRED EMBODIMENT

Figure 1:
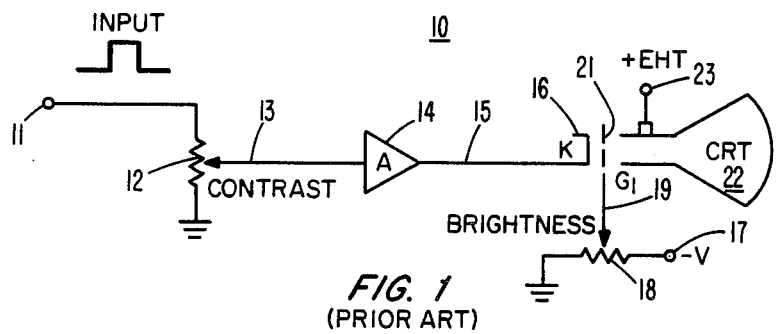
FIG. 1 is a functional diagram of a prior art single input cathode drive video amplifier.

Refer now to FIG. 1 showing a functional diagram of the prior art single input cathode drive video amplifier 10 employed in standard TV sets. Data is applied as signals to the input terminal 11 which is connected to ground through a potentiometer 12. The potentiometer wiper 13 is connected to the input of amplifier 14 to provide an amplified signal on line 15 which is connected to the cathode 16. A cutoff bias voltage $-V$ is connected to terminal 17 which is connected through a potentiometer 18 to ground. The wiper 19 of the potentiometer 18 is connected to the first grid 21. The cathode ray tube 22 is maintained at an extra high tension voltage applied to terminal 23. It will be understood that the differential voltage between the cathode 16 and the first grid 21 controls the flow of the elevators from the cathode 16 to the face of the cathode ray tube 22. It is apparent that the adjustment of the potentiometer 12 changes the amplitude of the input signal at the cathode 16. Adjustment of the potentiometer 18 directly adjusts the cutoff bias voltage applied to the wiper 19 connected to the first grid 21. Thus, it will be understood that adjustment of either potentiometer 12 or 18 affects the control of the electron beam being applied to the face of the cathode ray tube whether it be for foreground or background information.

Figure 2:
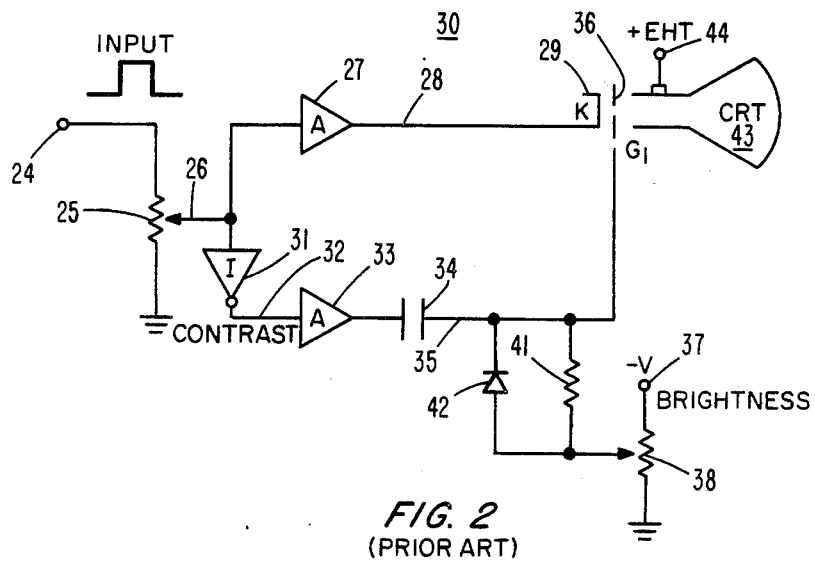
FIG. 2 is a functional diagram of a prior art single input differential cathode-grid drive video amplifier.

Refer now to FIG. 2 which is a functional diagram of another form of single input differential cathode-grid drive video amplifier 30. This particular differential drive video amplifier is employed in video display terminals of the type made by Sperry Corporation. The input data signal is applied to terminal 24 which is conneced to potentiometer 25 and to ground. The wiper 26 of the potentiometer 25 is directly connected to the input of amplifier 27 and the output of the amplifier is connected via line 28 to the cathode 29 similar to that explained hereinbefore with regards to FIG. 1. The same signal on wiper 26 is applied to an inverter 31 and the inverted output on line 32 is applied to a second amplifier 33. The output of amplifier 33 passes through capacitor 34 and is connected via line 35 to the first grid 36. The cutoff bias voltage $-V$ is applied to terminal 37 which is connected to the brightness potentiometer 38. The wiper 39 of the brightness potentiometer 38 is connected to the first grid 36 via a d.c. restoration clamp comprising a resistor 41 and a diode 42 in parallel therewith. The cathode ray tube 43 is held at a high voltage by an extra high tension voltage applied at terminal 44. The FIG. 2 embodiment permits half the voltage to be applied to the cathode 29 and the other half of the voltage to be applied to the first grid 36, thus, reducing the requirement for large signal amplifiers 27 and 33 to accomplish the differential voltage across the first grid and cathode. It should be observed that the mode of operation of the amplifiers shown in FIG. 2 controls the electron beam current being shown on the face of the cathode ray tube 43 in the same manner as explained hereinbefore with regards to FIG. 1. Thus, the brightness and contrast controls of the prior art embodiment shown in FIG. 1 and FIG. 2 are interactive by definition.

Figure 3:
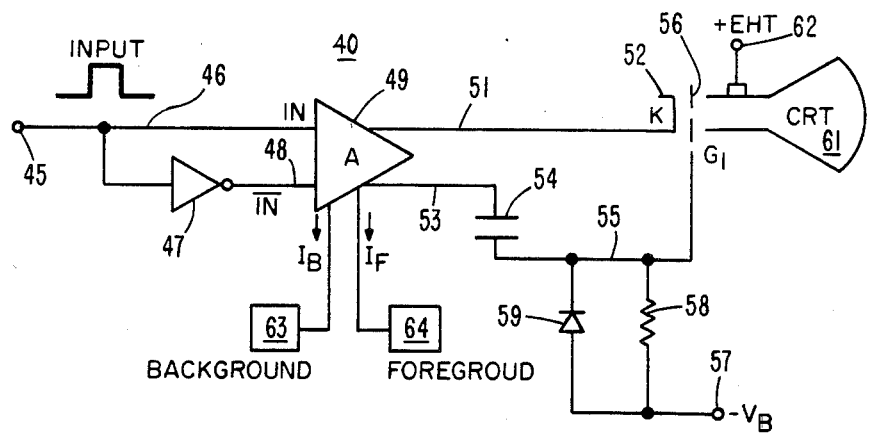
FIG. 3 is a functional diagram of the present invention single input differential cathode-grid drive video amplifier.

Refer now to FIG. 3 which is a functional diagram of the preferred embodiment of the present invention showing a single input differential cathode-grid drive video amplifier 40. The input signal is applied to input terminal 45 and is connected via line 46 directly to the normal input of a differential amplifier 49. The signal at input terminal 45 is connected to an inverter 47 to provide an inverted replica of the input signal on line 48 which is applied to the differential amplifier 49. The differential amplifier 49 provides a differential output on lines 51 and 53. One of the differential outputs on line 51 is applied directly to cathode 52. The other differential output line 53 is connected by a capacitor 54 and line 55 to the first grid 56. The cutoff bias voltage is applied to terminal 57 and is connected via a d.c. restoration clamp comprising resistor 58 and diode 59 to the first grid 56. The cathode ray tube 61 is maintained at an extra high tension voltage applied at terminal 62 of the cathode ray tube. It will be noted that no potentiometers are available to control the input signal 45 or the cutoff bias voltage applied at terminal 57. The background intensity is controlled by a constant current source 63 which is connected to differential amplifier 49 so as to control the voltage of the cathode alone. Similarly, the foreground intensity is controlled by a constant current source 64 which is connected to the differential amplifier 49 so as to control the voltage of the cathode and the first grid.

Refer now to FIG. 4 showing a novel differential amplifier 50 of the type employed in FIG. 3 to permit independent control of the background and foreground intensity. Differential amplifier 50 comprises a cathode branch 65 in parallel with a grid branch 66. The two branches of the differential amplifier are connected in series between a circuit source voltage $V_{CS}$ applied at terminal 67 and a circuit reference voltage applied at terminal 68 shown as ground. The cathode branch 65 comprises an impedence $Z_1$ connected in series with transistor $T_1$. It will be understood that other forms of transistors may be substituted for the transistor $T_1$ shown. An impedance $Z_2$ is connected in series with transistor $T_2$. The data input signal applied at terminal 45 of FIG. 3 is shown being applied to the differential amplifier at the base of transistor $T_1$. Similarly, the inverted input shown on line 48 is applied to the base of transistor $T_2$. The differential output lines 51 and 53 are shown connected to the cathode 52 and the first grid 56 in the same manner as shown in FIG. 3. Line 53 is connected to grid 56 through capacitor 54 and the grid 56 is held at cutoff voltage by the bias voltage applied through a d.c. restoration clamp comprising resistor 58 and diode 59. The aforementioned constant current control 64 is shown as an adjustable constant current source connected in the line 69 between the node 71 and the circuit reference voltage $V_{CR}$. Once the control 64 has been set, the current remains constant without further adjustment. The current $I_F$ in line 69 adjusts the amplitude of the voltage signal on line 51 which is connected to cathode 52 and similarly, adjusts the voltage signal on line 53 which is coupled to the first grid 56.

It will be understood that the impedance in transistors and the branches 65 and 66 are not required in be identical and that the control of the voltage signals on lines 51 and 53 will always be proportional depending on the values of the transistor load impedences $Z_1$ and $Z_2$. The constant current source 63 which controls the background intensity is shown connected via line 72 to node 73. The current in branch 65 flows through impedence $Z_1$ and transistor $T_1$ to line 69 and the current in branch 66 flows through impedance $Z_2$ and transistor $T_2$ to line 69. These currents are proportional to the impedance in branches 65 and 66 of the differential amplifier. The current $I_B$ is supplied from the branch 65 and from circuit source voltage $V_{CS}$ and flowing into node 73. The current at node 73 flows through line 72 to the circuit reference voltage terminal 68 via constant current source 63. As will be explained in detail hereinafter the amount of current flowing in constant current source 63 affects the peak voltage on line 51 and at the cathode 52 but does not affect the voltage on the first grid at line 53.

Refer now to FIGS. 5A, B and C and particularly, to the cathode voltage $V_K$ shown in FIG. 5A which occurs at the cathode 52. The typical waveform for input data is shown having a peak value 74 and a low value 75. The peak value 74 of $V_K$ is equal to $V_{CS} - I_B \cdot Z_1$ and is controllable by the background control 63. The low value of the cathode voltage $V_K$ shown at point 75 is equal to $V_{CS} - I_B \cdot Z_1 - I_F \cdot Z_2$ and is controllable by the background intensity control 63 and the foreground intensity control 64. When the current $I_B$ is increased, the peak value shown at 74 decreases. Similarly, when the background current $I_B$ is increased, the low value voltage at point 75 also decreases.

Refer now to FIG. 5B showing the first grid voltage $V_G$ at grid 56. The peak value shown at 76 is adjustable and the low value shown at 77 is fixed by the cutoff bias voltage at terminal 57. It will be understood that the cutoff bias voltage is not an externally controlled voltage but may be controlled internally when the video display terminals are being manufactured and passed through quality control. The first grid voltage $V_G$ at the peak 76 is equal to $V_B + I_F \cdot Z_2$, and as explained hereinbefore, the low value voltage of $V_G$ is maintained substantially at the voltage $V_B$. When the foreground intensity current $I_F$ is increased, the peak value 76 increases because the grid is clamped at $V_B$. However, the increase in current $I_F$ causes the low value voltage shown at 75 to decrease, thus, causing the intensity of the foreground information to increase. The the background intensity is unaffected.

Refer now to FIG. 5C showing a translation of the voltage curves in FIGS. 5A and 5B to the equivalent intensity on the CRT display. The background value shown at point 78 is independently adjustable as explained hereinbefore. Similarly, the foreground level 79 is independently adjustable as explained hereinbefore. The magnitude of the waveform shown in FIG. 5C between the levels 78 and 79 represents the contrast ratio CR between foreground and background. Thus, an increase of the foreground intensity without changing the background intensity increases the ratio and inversely, if the foreground intensity level shown at 79 is maintained constant and the background level 78 is decreased, the contrast ratio also increases. As the background and foreground levels 78,79 approach each other, the contrast ratio is substantially diminished. The contrast ratio CR shown in FIG. 5C is proportional to the height of the voltages shown in FIGS. 5A and 5B. It will be understood from the explanation of FIGS. 5A to 5C that the operator may adjust the contrast ratio to a desired level by independently adjusting the foreground and background intensities.

Having explained the present invention employing a dual input and dual output differential amplifier, it will be understood that the present invention may easily be embodied into an integrated circuit or may be embodied into a module which may be retrofitted into existing video display terminals or cheaply incorporated into new video display terminals. Further, having explained the present invention with reference to a video display terminal, it will now be understood that the present invention is not intended to be employed in standard commercially manufactured home television sets but the invention may be employed into cathode ray tubes of the type used in high quality video display terminals for graphics displays as well as alpha-numeric displays.

We claim:

1. A video amplifier for independently controlling the background and foreground intensity of a CRT comprising:
   a CRT of the type having a cathode and a first grid;
   a differential amplifier of the type having a pair of differential input terminals and a pair of differential output terminals;
   said input terminals being coupled to a data source;
   said output terminals being coupled to said grid and said cathode;
   a foreground control connected to said differential amplifier for controlling the voltage of said cathode and said grid; and
   a backgrund control connected to said differential amplifier for controlling the voltage of said cathode alone, whereby the intensity of the background and the intensity of the foreground are independently controllable on said CRT without interaction.

2. A video amplifier circuit as set forth in claim 1 wherein said differential amplifier comprises:
   a cathode branch in parallel with a first grid branch;
   each said branch comprising a transistor load impedance in series with a transistor;
   each said branch being in series between a circuit source voltage and a reference voltage; and
   one of said differential input terminals being connected to the control electrode of one of said transistors in one of said branches and the other differential input being connected to the control electrode of the transistor in the other branch.

3. A video amplifier circuit as set forth in claim 2 wherein the signal on one of said differential input terminals is the inverse of the signal on the other of said differential input terminals.

4. A video amplifier circuit as set forth in claim 2 wherein the first grid of said CRT is connected between the transistor load impedance and the transistor of one of said branches.

5. A video amplifier circuit as set forth in claim 4 wherein the cathode of said CRT is connected between the transistor load impedance and the transistor in the other branch of said differential amplifier.

6. A video amplifier circuit as set forth in claim 2 wherein said foreground control is connected in series between said circuit reference voltage and parallel branches.

7. A video amplifier circuit as set forth in claim 2 wherein said background control is connected in series between said circuit reference voltage and said cathode.

8. A video amplifier circuit as set forth in claim 2 wherein said background control and said foreground control comprise adjustable constant current sources.

9. A video amplifier circuit as set forth in claim 6 wherein said foreground control comprises a constant current source.

10. A video amplifier circuit as set forth in claim 7 wherein said background control comprises a constant current source.

11. A video amplifier circuit as set forth in claim 2 which further comprises a voltage clamp connected to said first grid.

12. A video amplifier circuit as set forth in claim 2 which further includes a bias reference voltage means connected to the first grid of said CRT.

13. A video amplifier circuit as set forth in claim 12 wherein said bias reference voltage means comprises a resistor and a diode in parallel to provide a clamp reference voltage on said grid.

14. A video amplifier circuit as set forth in claim 13 wherein said bias reference voltage means is adjustable to the cutoff voltage of individual CRT's.

15. A video amplifier circuit as set forth in claim 4 which further includes a capacitor in series between said grid and said grid branch of said differential amplifier for a.c. coupling said grid to said grid branch of said differential amplifier.

* * * * *